United States Patent [19]
Jang

[11] Patent Number: 5,355,033
[45] Date of Patent: Oct. 11, 1994

[54] DATA INPUT BUFFER CIRCUIT FOR USE IN A SEMICONDUCTOR MEMORY DEVICE

[75] Inventor: Hyun-Soon Jang, Suwon, Rep. of Korea

[73] Assignee: SamSung Electronics Co., Ltd., Suwon, Rep. of Korea

[21] Appl. No.: 726,188

[22] Filed: Jul. 5, 1991

[30] Foreign Application Priority Data

May 24, 1991 [KR] Rep. of Korea .................. 1991-8453

[51] Int. Cl.⁵ .............. H03K 19/0175; H03K 19/0948
[52] U.S. Cl. .................................... 307/475; 307/443; 307/296.8; 307/451
[58] Field of Search ...................... 307/475, 451, 296.6, 307/296.8, 443, 550

[56] References Cited

U.S. PATENT DOCUMENTS

| | | | |
|---|---|---|---|
| 4,464,587 | 8/1984 | Suzuki et al. | 307/451 |
| 4,687,954 | 8/1987 | Yasuda et al. | 307/475 |
| 4,833,342 | 5/1989 | Kiryu et al. | 307/296.8 |
| 4,929,853 | 5/1990 | Kim et al. | 307/451 |
| 5,034,623 | 7/1991 | McAdams | 307/451 |

*Primary Examiner*—Edward P. Westin
*Assistant Examiner*—Jon Santamauro
*Attorney, Agent, or Firm*—Robert E. Bushnell

[57] ABSTRACT

The invention is to provide a data input buffer which can attain stably an input trip level regardless of a variation of power source voltage, for use in a semiconductor memory device, and particularly to provide a data input buffer which is not affected by a variation of power source voltage. The data input buffer circuit comprises a conductive passage, coupled between the power source voltage and a level sensing node, for adjusting the amount of an current according to a level of input voltage; and an insulation gate field effect transistor, with one end of channel of the transistor connected to the conductive passage, other end of channel of the transistor connected to ground voltage terminal and a gate of the transistor to which voltage is applied according to a level of the power source voltage.

29 Claims, 3 Drawing Sheets

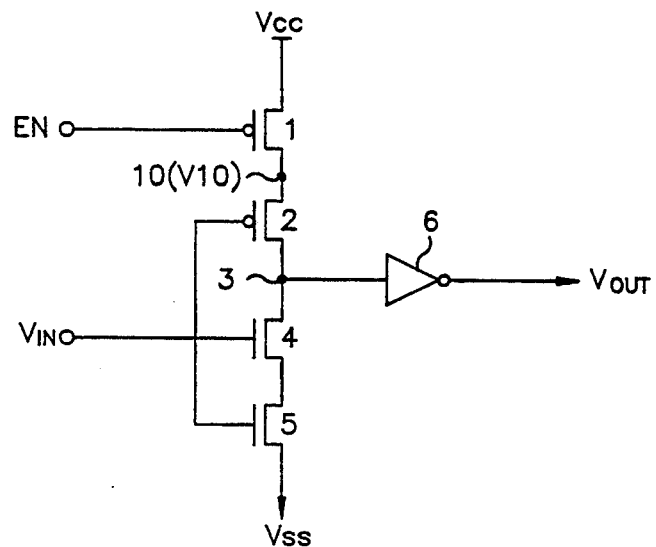
FIG. 1A
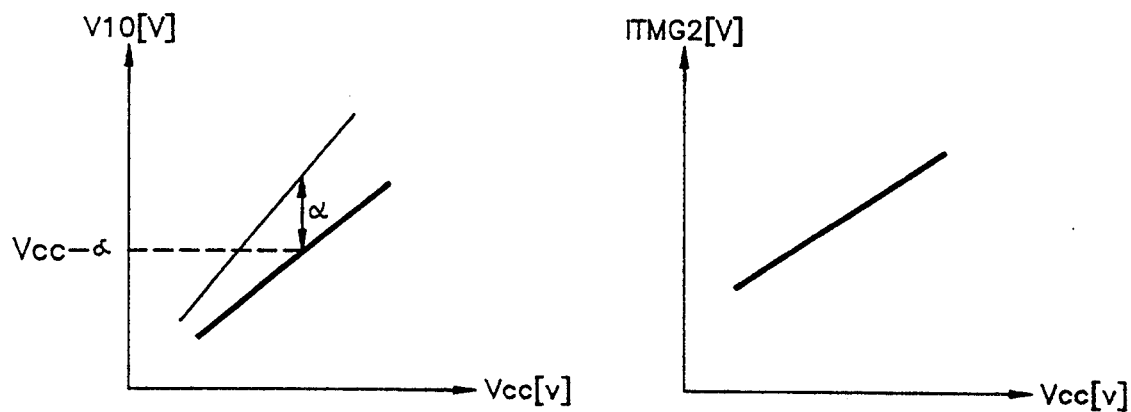
FIG. 1B
FIG. 1C

DATA INPUT BUFFER CIRCUIT FOR USE IN A SEMICONDUCTOR MEMORY DEVICE

BACKGROUND OF THE INVENTION

The present invention relates to a data input buffer used in a semiconductor memory device and particularly to a data input buffer which is not affected by the variation of the power source voltage.

In the semiconductor memory device, each pin is equipped with data input buffers which convert the TTL level signal inputted from the outside into a C-MOS level signal usable in the inside of the semiconductor memory device.

In order to satisfactorily buffer address signals and various control signals which are applied from the outside of semiconductor memory chip, the stability of data input buffer operation is required.

In the general data input buffer, an input trip level is set to determine a predetermined logic state from the TTL level signal which enters from the outside. The trip level is determined according to the size of C-MOS transistor which constitutes a buffer. However, variation of power source voltage lowers the reliability of buffer by making the input trip level unstable.

Referring to FIG. 1A the conventional data input buffer circuit is shown, the conventional data input buffer is connected to power source voltage terminal $V_{cc}$ through P-MOS transistor 1 which is controlled by a buffer enable signal EN. The input voltage $V_{in}$, which is applied by a TTL level outside signal, is connected in common to P-MOS transistor 2, N-MOS transistor 4 and gate 5. The potential of sensing node 3 which connects the drain of said P-MOS transistor 2 and the drain of said N-MOS transistor 4 attains to output voltage $V_{out}$, a final output of data input buffer, through inverter 6 and the output voltage $V_{out}$ is supplied to the inside chip.

FIG. 1B shows the voltage variation (10 V) of the source terminal 10 of P-MOS transistor 2 according to the variation of the power source voltage $V_{cc}$ FIG. 1C shows an input trip margin (or the amount of voltage which varied between source and drain) of P-MOS transistor 2 according to the variation of the power source voltage in the circuit of the FIG. 1A, when the level of the input voltage $V_{in}$ is inputted is lower than 0.8 V, the P-MOS transistor 2 turns on and a level of output voltage $V_{out}$ attains to a low state. When the circuit operates, the voltage V10 of the source terminal 10 of the P-MOS transistor 2 is in $V_{cc}$-α condition (α is a voltage drop by P-MOS transistor) because the buffer enable signal EN is in a low state. When the P-MOS transistor 2 turns on and an electric current flows, the voltage V10 drops. However, the voltage V10 rises from the initial value $V_{cc}$-α when power source voltage $V_{cc}$ rises, as illustrated in FIG. 1A. Due to a rise voltage V10 of the source terminal 10, a difference of gate-to-source voltage $|V_{in}-V10|$ of P-MOS transistor 2 increases. Therefore, voltage appearing in the sensing node 3 (or input trip margin ITMG) rises according to a rise in power source voltage $V_{cc}$, as illustrated in the graph of FIG. 1C. In other words, input level trip margin expands because the difference of gate-to source voltage $V_{GS}=|V_{in}-V10|$ of P-MOS transistor 2 increases due to a rise in V10 consequent on a rise in power source voltage $V_{cc}$.

Consequently, in such a conventional circuit as stated above, output voltage shows a high state even when input level is higher than 0.8 V, not to speak of when the input level is lower than 0.8 V. Even in the case where power source voltage drops abnormally, an input trip margin ITMG of the P-MOS transistor 2 also increases as in the case where the power source voltage rises. In this case, a low state can be outputted if input level is lower than 2.4 V.

BRIEF DESCRIPTION OF THE DRAWINGS

For a better understanding of the invention and to show how the same may be carried into effect, reference will now be made, by way of example, to the accompanying diagrammatic drawings, in which:

FIG. 1A shows a circuit diagram of the conventional data input buffer;

FIGS. 1B and 1C illustrate the graphs showing voltage characteristic according to a conventional data input buffer circuit;

SUMMARY OF THE INVENTION

It is, therefore, an object of the present invention to provide a data input buffer which has a stable a input trip level regardless of power source voltage variation.

It is another object of the present invention to provide a data input buffer which has a small change in velocity from input to output in response to a variation of power source voltage.

In order to accomplish above mentioned objects, the present invention is characterized in that, in the data input buffer connected to power source voltage, it is equipped with a conductive passage which, connected between power source voltage and a predetermined level sensing node, adjusts the amount of an electric current according to a level of input voltage and an insulation gate field effect transistor with one end of its channel connected to the conductive passage and other end of its channel connected to ground voltage terminal and its gate to which voltage is applied according to the level of the power source voltage.

DETAILED DESCRIPTION OF THE INVENTION

Figure 2:
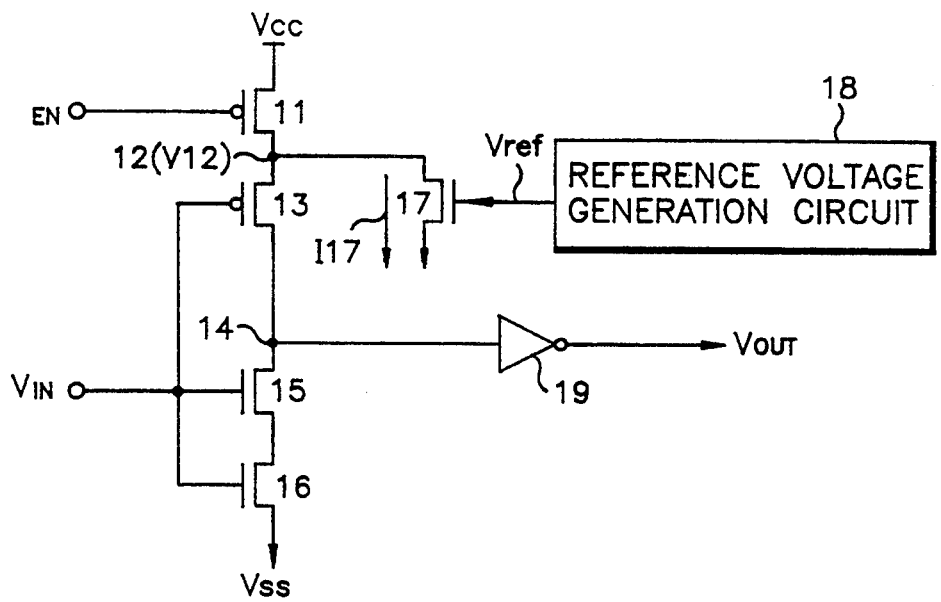
FIG. 2 shows a data input buffer circuit diagram according to the present invention.

Referring to FIG. 2, the circuit of P-MOS transistors 11, 13, N-MOS transistors 15, 16 and inverter 19 are formed in the same manner as that of FIG. 1, but the channel of N-MOS transistor 17 with its gate connected to the output terminal of reference voltage generation circuit 18 is formed between the source node 12 of said P-MOS transistor 13 and ground voltage terminal $V_{ss}$. The reference voltage generation circuit 18 produces reference voltage $V_{ref}$. In the operation of data input buffer according to the present invention, the source node voltage $V_{12}$ of the P-MOS transistor 13, the channel current $I_{17}$ of the N-MOS transistor 17 and the reference voltage $V_{ref}$ are an object of important consideration.

Figure 3:
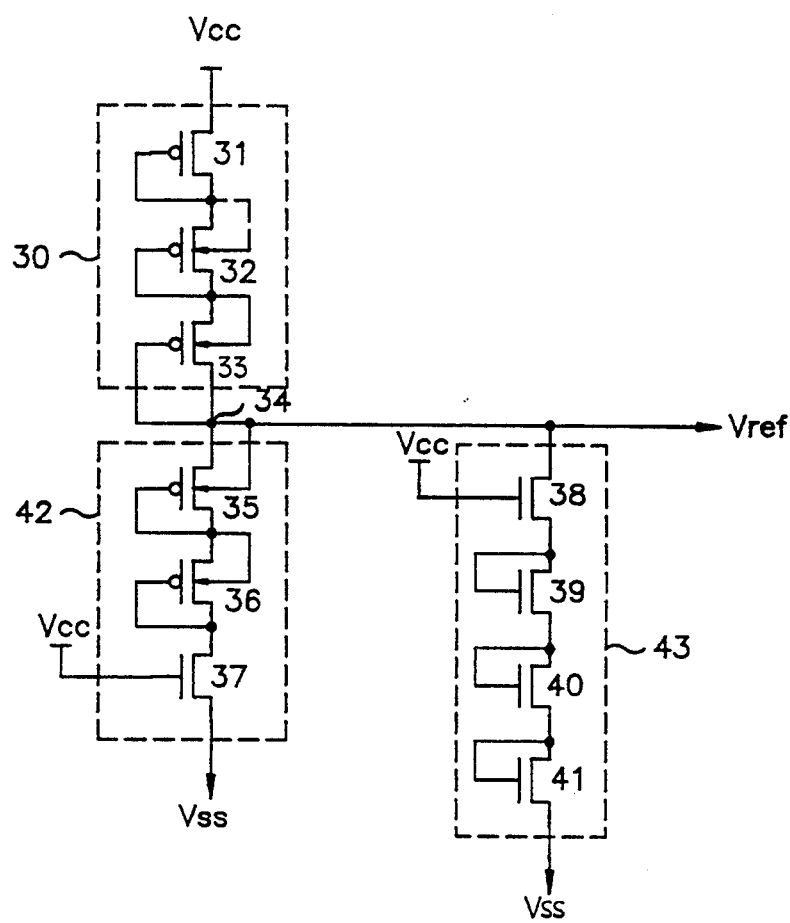
FIG. 3 shows an internal structural diagram of the reference voltage generation circuit shown in FIG. 2.

Referring to FIG. 3, between power source voltage terminal $V_{cc}$ and reference voltage node 34, P-MOS transistors 31, 32, 33 with diodes connected are connected in series from the power source voltage terminal $V_{cc}$ to the reference voltage node 34. Between the reference voltage node 34 and ground voltage terminal $V_{ss}$, a first clamping circuit 42 and a second clamping circuit 43 are connected in parallel. The first clamping circuit 42 comprises P-MOS transistors 35, 36 with diodes connected in series from the reference voltage node 34 and an N-MOS transistor 37 with a gate connected to power source terminal $V_{cc}$. The second clamping circuit 43 comprises an N-MOS transistor 38 with a gate connected to power source voltage terminal $V_{cc}$ and N-MOS transistors 39, 40, 41 with diodes connected in series from the source of the N-MOS transistor 38. The P-MOS transistors 31, 32, 33 connected in series between the power source voltage terminal $V_{cc}$ and the reference voltage node 34 function as a voltage follower which shows the potential of the reference voltage node 34 according to a level of the power source voltage $V_{cc}$. The number of those P-MOS transistors is adjustable at need. The voltage follower can be composed of other general resistances or diodes. It is not necessary to use P-MOS transistors positively. Those who have a usual technical knowledge in this field can easily understand that the first and second clamping circuits 42, 43 can also be composed of other elements. Moreover, the clamping operations of the first and second clamping circuits 42, 43 can be enabled or disabled by supplying a predetermined clock instead of power source voltage $V_{cc}$ to the gates of the N-MOS transistors 37, 38.

Figure 4B:
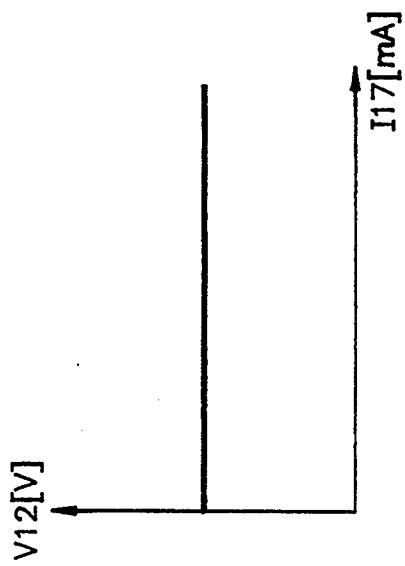
FIG. 4B illustrates the graph showing a current characteristic according to the present invention.
Figure 4A:
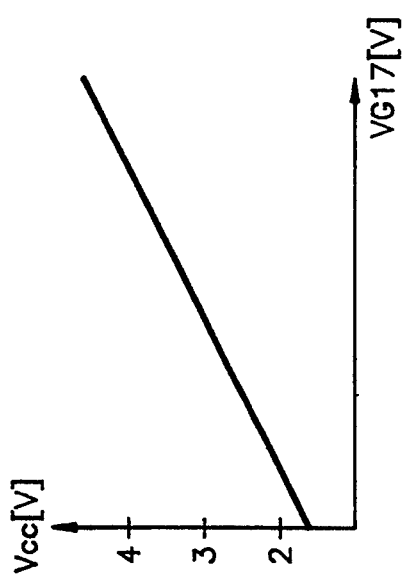
FIG. 4A illustrates the graph showing a voltage characteristic according to the present invention.

The graph of FIG. 4A shows a correlation between power source voltage $V_{cc}$ and reference voltage $V_{ref}$ (or gate voltage $V_g$ of N-MOS transistor 17) and the graph of FIG. 4B shows a correlation between a voltage $V_{12}$ of the source node 12 of P-MOS transistor 13 and the channel current $I_{17}$ of N-MOS transistor 17 which are illustrated in FIG. 2. Then the operation of the present invention will be described by referring to the graphs of the FIGS. 4A, 4B, the FIGS. 2 and 3. For the convenience of description, the threshold voltages of P-MOS and N-MOS transistors applied to the reference voltage generation circuit 18 are valued at 1 as the absolute value. The reference voltage generation circuit 18 supplies the voltage at a level corresponding to a variation of power source voltage to the gate on N-MOS transistor 17 shown in FIG. 2. (Refer to FIG. 4A). The voltage follower 30 composed of P-MOS transistors 31, 32 and 33 as shown FIG. 3 produces a voltage of $|V_{cc} - 3V_{tp}|$ at the reference voltage node 34. The first clamping circuit 42 clamps the reference voltage $V_{ref}$ to the extent of $2V_{tp}$ and the second clamping circuit 43 clamps the reference voltage to the extent of $3V_{tn}$. Supposing that power source voltage $V_{cc}$ is 5 V, the values of the above are 2 V, 2 V and 3 V respectively.

Accordingly, when the level of the power source voltage lowers from its initial 5 V, the reference voltage node 34 is connected to the present low power source voltage. In this case, the lowered reference voltage $V_{ref}$ is applied to the gate of N-MOS transistor 17, so that conductivity of N-MOS transistor 17 is reduced and the $V_{12}$ voltage is thereby prevented from being reduced further.

On the other hand, when the level of the power source voltage rises above 5 V, the reference voltage node 34 is connected to ground voltage terminal $V_{ss}$ through the first clamping circuit 42. In this case, the reference voltage $V_{ref}$ attains to a level of about 3 V and this level increases a channel current $I_{17}$ by improving the conductivity of N-MOS transistor 17, so that a rise in a level of the source node voltage $V_{12}$ caused by a rise in the power source voltage is thereby disturbed.

When the power source voltage rises still more and exceeds 6 V or so, the reference voltage node 34 is clamped to a level of about 4 V by the second clamping circuit 43. As it makes the conductivity of N-MOS transistor 17 greater than in the above case, it makes flow more channel current $I_{17}$.

Consequently, the source node voltage $V_{12}$ of P-MOS transistor 12 as shown in FIG. 2 is maintained constant by adjusting the current driving ability (or conductivity) of said N-MOS transistor 17 according to a variation of power source voltage even in the case where power source voltage $V_{cc}$ lowers or rises abnormally, as illustrated in FIG. 4B.

Referring to the Table 1, the result of simulation tells that the conventional art makes a difference of 0.35 V in input trip level which varies according to a variation of power source voltage but the present invention makes a difference of 0.18 V.

TABLE 1

| Condition ($V_{cc}$) Unit (V) | 4 V 80° C. | 5 V 25° C. | 6 V −5° C. | ΔV |
|---|---|---|---|---|
| Conventional Circuit | 1.184 V | 1.384 V | 1.534 V | 0.35 V |
| Inventive Circuit | 1.257 V | 1.389 V | 1.445 V | 0.18 V |

TABLE 2

| Condition ($V_{cc}$) | at Minimum $V_{cc}$ | at Maximum $V_{cc}$ | ΔS |
|---|---|---|---|
| Conventional Circuit | 1.2 ns | 2.2 ns | 1.0 ns |
| Inventive Circuit | 0.3 ns | 0.6 ns | 0.3 ns |

According to the Table 2, the conventional art makes a difference of 1.0 ns in velocity from input to output between the maximum value and minimum value of power source voltage but the present invention is greatly improved by making a difference of 0.3 ns. Although there can be a little difference in the results of comparison shown in the Table 1 and 2 depending on the embodied circuit formation and simulation environment, improvement effect based on the present invention will still be produced.

As described hereinbefore, the present invention has the effect of securing the operational stability and reliability of data input buffer by seeing to it that input trip level is not affected by a variation of power source voltage in the data input buffer.

What is claimed is:

1. A data input buffer circuit in a semiconductor memory device, said data input buffer circuit comprising:

a first transistor having a first gate electrode;

an insulation gate field effect transistor having a channel connected between a channel of said first transistor and a reference voltage terminal for providing a reference voltage, and a conductivity of said insulation gate field effect transistor being controlled in response to a voltage level of a supply voltage terminal for providing a supply voltage; and a reference voltage generation circuit comprising a plurality of clamping circuits each generating different clamping voltages, and generating a reference voltage generation circuit signal being received by a gate of said insulation gate field effect transistor.

2. A data input buffer circuit according to claim 1, wherein a junction between said insulation gate field effect transistor and said first transistor is:
charged when a voltage of said supply voltage terminal is at a first condition; and
discharged to said reference voltage through the channel of said insulation gate field effect transistor when said voltage of said supply voltage terminal is at a second condition.

3. A data input buffer circuit in a semiconductor device, comprising:
resistance means connected between a supply voltage terminal for providing a supply voltage and a reference node, for conducting a current;
data input buffer means connected between a reference voltage terminal for providing a reference voltage and said reference node, for receiving and converting a semiconductor device input level signal into an internal level signal in response to a trip level;
transistor for stabilizing a voltage of said reference node by regulating a level of said current, said transistor having a gate receiving a reference voltage signal; and
a reference voltage generation circuit for generating said reference voltage signal, comprising a plurality of clamping circuits each having a different clamping voltage.

4. A data input buffer circuit, as claimed in claim 3, wherein said data input buffer means comprises:
a P-channel transistor having a channel connected between said reference node and a data input buffer output node, and a gate electrode receiving said semiconductor device input level signal; and
a N-channel transistor having a channel connected to said data input buffer output node and a gate electrode receiving said semiconductor device input level signal.

5. A data input buffer circuit in a semiconductor device, comprising:
resistance means connected between a supply voltage terminal for providing a supply voltage and a reference node, for conducting a current;
data input buffer means connected between a reference voltage terminal for providing a reference voltage and said reference node, for receiving and converting a semiconductor device input level signal into an internal level signal in response to a trip level;
first transistor means for stabilizing a voltage of said reference node by regulating a level of said current, said transistor having a gate electrode receiving a reference voltage signal; and
a reference voltage generation circuit for generating said reference voltage signal, said reference voltage generation circuit comprising:
voltage follower means connected between said gate electrode of said transistor means and said supply voltage terminal;
first clamping means connected between said gate electrode of said transistor means and said reference voltage terminal; and
second clamping means connected between said gate electrode of said transistor means and said reference voltage terminal.

6. A data input buffer circuit, as claimed in claim 5, wherein said voltage follower means comprises a plurality of P-channel metal oxide semiconductor transistors connected in series.

7. A data input buffer circuit, as claimed in claim 5, wherein said first clamping means comprises a plurality of series connected P-channel metal oxide semiconductor transistors and an N-channel metal oxide semiconductor transistor connected in series, wherein a gate electrode of said N-channel metal oxide semiconductor transistor is connected to said supply voltage terminal.

8. A data input buffer circuit, as claimed in claim 5, wherein said second clamping means comprises a plurality of series connected N-channel MOS transistors, wherein a gate electrode of one of said plurality of N-channel MOS transistors is connected to said supply voltage terminal.

9. A data input buffer circuit, as claimed in claim 5, wherein said first clamping means comprises a plurality of series connected P-channel MOS transistors and an N-channel MOS transistor connected in series, wherein a gate electrode of said N-channel MOS transistor is connected to receive an enable signal.

10. A data input buffer circuit in a semiconductor device, comprising:
an enable transistor connected between a supply voltage terminal and a source node, for enabling said data input buffer circuit in response to a buffer enable signal, said supply voltage terminal for providing a supply voltage;
an input voltage receiving portion comprising a first input transistor connected between said source node and a sensing node and receiving an input voltage at a gate electrode, a second input transistor and a third input transistor cascade connected between said sensing node and a reference voltage terminal, each one of said third input transistor and said second input transistor for receiving said input voltage at a corresponding gate electrode, said reference voltage terminal for providing a reference voltage;
a current regulating transistor connected between said source node and said reference voltage terminal, for regulating a current through said enable transistor in response to a reference voltage signal indicative of a voltage level of said supply voltage terminal to thereby stabilize a trip voltage of said data input buffer circuit, and
a reference voltage generation circuit for generating said reference voltage signal, said reference voltage generation circuit comprising a clamping circuit for clamping said reference voltage signal to a particular level, connected between a gate electrode of said current regulating transistor and said reference voltage terminal.

11. A data input buffer circuit in a semiconductor device comprising:
an enable transistor between a supply voltage terminal and a source node, for enabling said data input buffer circuit in response to a buffer enable signal, said supply voltage terminal for providing a supply voltage;
an input voltage receiving portion comprising a first input transistor connected between said source node and a sensing node and receiving an input voltage at a gate electrode, a second input transistor and a third input transistor cascade connected between said sensing node and a reference voltage terminal, each one of said second input transistor and said third input transistor for receiving said input voltage at a corresponding gate electrode, said reference voltage terminal for providing a reference voltage;

a current regulating transistor connected between said source node and said reference voltage terminal, for resulting a current through said enable transistor in response to a reference voltage signal indicative of a voltage level of said supply voltage terminal to thereby stabilize a trip voltage of said data input buffer circuit; and a reference voltage generation circuit for generating said reference voltage signal, said reference voltage generation circuit comprising a first clamping circuit and a second clamping circuit connected in parallel between a gate of said current regulating transistor and said reference voltage terminal.

12. A data input buffer as claimed in claim 11, wherein said first clamping circuit and said second clamping circuit have different clamping voltages.

13. A data input buffer as claimed in claim 11, wherein said first clamping circuit comprises an N-MOS transistor having a gate electrode connected to said supply voltage terminal and being series connected with a plurality of diode connected P-MOS transistors.

14. A data input buffer as claimed in claim 11, wherein said second clamping circuit comprises a first clamping transistor having a gate electrode connected to said supply voltage terminal and being series connected with a plurality of diode connected transistors.

15. A data input buffer as claimed in claim 11, wherein said reference voltage generation circuit further comprises a voltage follower connected between said supply voltage terminal and said gate electrode of said current regulating transistor.

16. A data input buffer as claimed in claim 15, wherein said voltage follower comprises a plurality of diode connected transistors connected in series to each other.

17. A data input buffer as claimed in claim 11, wherein said reference voltage generation circuit further comprises a voltage follower connected between said supply voltage terminal and said gate electrode of said current regulating transistor.

18. A data input buffer as claimed in claim 17, wherein said voltage follower comprises a plurality of diode connected transistors connected in series to each other.

19. A data input buffer circuit in a semiconductor device, comprising:

an enable transistor connected between a supply voltage terminal and a source node, for enabling said data input buffer circuit in response to a buffer enable signal, said supply voltage terminal for providing a supply voltage;

an input voltage receiving portion comprising a plurality of input transistors connected between said source node and a reference voltage terminal, each one of said input transistors coupled for receiving an input voltage at a gate electrode, said reference voltage terminal for providing a reference voltage;

a current regulating transistor connected between said source node and said reference voltage terminal, for regulating a current through said enable transistor in response to a reference voltage signal indicative of a voltage level of said supply voltage terminal and thereby stabilizing a trip voltage of said data input buffer circuit; and a reference voltage generation circuit for generating said reference voltage signal, said reference voltage generation circuit comprising a first clamping circuit and a second clamping circuit connected in parallel between a gate electrode of said current regulating transistor and said reference voltage terminal.

20. A data input buffer as claimed in claim 19, wherein said first clamping circuit and said second clamping circuit have different clamping voltages.

21. A data input buffer as claimed in claim 19, wherein said first clamping circuit comprises an N-MOS transistor having a gate electrode connected to said supply voltage terminal and being series connected with a plurality of diode connected P-MOS transistors.

22. A data input buffer as claimed in claim 19, wherein said second clamping circuit comprises a first clamping transistor having a gate electrode connected to said supply voltage terminal and being series connected with a plurality of diode connected transistors.

23. A data input buffer as claimed in claim 19, wherein said reference voltage generation circuit further comprises a voltage follower connected between said supply voltage terminal and said gate electrode of said current regulating transistor.

24. A data input buffer as claimed in claim 23, wherein said voltage follower comprises a plurality of diode connected transistors connected in series.

25. The data input buffer as claimed in claim 1, further comprising an input voltage receiving portion, said input voltage receiving portion comprising:

a second transistor connected between a source node and a sensing node and receiving an input voltage at a second gate electrode;

a third transistor connected between said sensing node and said reference voltage terminal and receiving said input voltage at a third gate electrode;

a fourth transistor cascade connected between said third transistor and said reference voltage terminal and receiving said input voltage at a fourth gate electrode.

26. The data input buffer as claimed in claim 1, wherein said reference voltage generation circuit further comprises voltage follower means comprising a plurality of P-channel metal oxide semiconductor transistors connected in series.

27. The data input buffer as claimed in claim 3, wherein said reference voltage generation circuit further comprises voltage follower means comprising a plurality of P-channel metal oxide semiconductor transistors connected in series.

28. The data input buffer as claimed in claim 10, wherein said clamping circuit comprises first and second clamping means, said first and second clamping means having different clamping voltages.

29. The data input buffer as claimed in claim 10, wherein said reference voltage generation circuit further comprises voltage follower means comprising a plurality of P-channel metal oxide semiconductor transistors connected in series.

* * * * *

UNITED STATES PATENT AND TRADEMARK OFFICE
CERTIFICATE OF CORRECTION

PATENT NO. : 5,355,033

DATED : October 11, 1994

INVENTOR(S) : Hyun-Soon JANG

It is certified that error appears in the above-indentified patent and that said Letters Patent is hereby corrected as shown below:

Column 1, line 8, delete "the";

line 26, after "1A", insert --,--, line 41, after "$V_{cc}$", insert --.--.

Column 7, claim 11, line 8, change "resulting" to --regulating--.

Signed and Sealed this

Sixth Day of June, 1995

Attest:

BRUCE LEHMAN

Attesting Officer     Commissioner of Patents and Trademarks